(12) United States Patent
Wu et al.

(10) Patent No.: US 12,382,595 B2
(45) Date of Patent: Aug. 5, 2025

(54) ELECTRONIC DEVICE

(71) Applicant: InnoLux Corporation, Miao-Li County (TW)

(72) Inventors: Yuan-Lin Wu, Miao-Li County (TW); Mei-Chi Hsu, Miao-Li County (TW); Fu-Zhang Kuo, Miao-Li County (TW); Chung-Wen Yen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 245 days.

(21) Appl. No.: 18/316,330

(22) Filed: May 12, 2023

(65) Prior Publication Data

US 2023/0422418 A1 Dec. 28, 2023

(30) Foreign Application Priority Data

Jun. 24, 2022 (CN) .......................... 202210738955.1

(51) Int. Cl.
*H05K 7/20* (2006.01)
*H05K 5/02* (2006.01)

(52) U.S. Cl.
CPC ......... *H05K 5/0217* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 10,747,269 B1* | 8/2020 | Choi | G06F 1/1652 |
| 11,204,627 B2* | 12/2021 | Park | H04M 1/0268 |
| 11,445,622 B2 | 9/2022 | Shin et al. | |
| 12,066,865 B2* | 8/2024 | Zhang | G06F 1/1683 |
| 2016/0374228 A1* | 12/2016 | Park | G09F 9/301 |
| 2018/0192527 A1* | 7/2018 | Yun | G09F 9/301 |
| 2021/0360799 A1* | 11/2021 | Jia | G09F 9/301 |
| 2021/0397218 A1* | 12/2021 | Seo | G06F 1/1616 |
| 2022/0005386 A1* | 1/2022 | Kim | G06F 1/1616 |
| 2022/0053659 A1* | 2/2022 | Kim | H05K 5/03 |
| 2022/0159847 A1* | 5/2022 | Ahn | G06F 1/1616 |
| 2022/0174828 A1* | 6/2022 | Nam | G06F 1/1641 |

FOREIGN PATENT DOCUMENTS

| | | |
|---|---|---|
| CN | 110335546 A | 10/2019 |
| TW | 202016683 A | 5/2020 |
| TW | M630870 U | 8/2022 |

OTHER PUBLICATIONS

Chinese language office action dated May 13, 2025, issued in application No. 112110220.

* cited by examiner

*Primary Examiner* — Xanthia C Relford (74) *Attorney, Agent, or Firm* — McClure, Qualey & Rodack, LLP (57) ABSTRACT

An electronic device is provided, including a panel and a supporting sheet. The panel includes a foldable region with a folding axis. The supporting sheet is disposed under the panel, and includes a foldable portion and a first non-foldable portion. The foldable portion is overlapped with the foldable region. The first non-foldable portion is connected to the foldable portion, and includes a first part and a second part. The first part is located between the second part and the foldable portion. The first part has a first via, and the first part protrudes more in a first direction parallel to the folding axis with respect to the second part.

20 Claims, 7 Drawing Sheets

ELECTRONIC DEVICE

CROSS REFERENCE TO RELATED APPLICATIONS

This application claims the benefit of China Patent Application No. 202210738955.1, filed Jun. 24, 2022, the entirety of which is incorporated by reference herein.

BACKGROUND OF THE DISCLOSURE

Field of the Disclosure

The application relates in general to an electronic device, and in particular, to an electronic device having a foldable panel.

Description of the Related Art

For people with modern lifestyles, electronic products are indispensable tools used for working, learning, and entertainment.

The customer expects the appearance of the electronic product to be thinner and lighter, or that it be flexible, to meet his needs. However, the yield rate for manufacturing the flexible electronic device needs to be improved if market demand is to be met. Therefore, how to address the aforementioned problem has become an important issue.

BRIEF SUMMARY OF DISCLOSURE

An embodiment of the disclosure provides an electronic device, including a panel and a supporting sheet. The panel includes a foldable region with a folding axis. The supporting sheet is disposed under the panel, and includes a foldable portion and a first non-foldable portion. The foldable portion is overlapped with the foldable region. The first non-foldable portion is connected to the foldable portion, and includes a first part and a second part. The first part is located between the second part and the foldable portion. The first part has a first via, and the first part protrudes more in a first direction parallel to the folding axis with respect to the second part.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSURE

Hereinafter, exemplary embodiments of the invention are described in detail, and examples of the exemplary embodiments are conveyed via the figures. Wherever possible, the same reference numerals are used in the figures and the descriptions to refer to the same or similar portions.

Throughout the disclosure, certain words are used to refer to specific elements in the specification and the claims. Those skilled in the art should understand that electronic device manufacturers may refer to the same components by different names. The present specification does not intend to distinguish between components that have the same function but different names. In the following specification and the claims, words such as "containing" and "including" are open-ended words, so they should be interpreted as meaning "containing/including but not limited to . . . ".

In the present specification, wordings used to indicate direction, such as "up," "down," "front," "back," "left," and "right", merely refer to directions in the drawings. Therefore, the directional terms are used to illustrate and are not intended to limit the disclosure. In the drawings, the figures depict typical features of the methods, structures, and/or materials used in the particular embodiments. However, the figures are not to be interpreted as defining or limiting the scope or nature of the embodiments. For example, the relative size, thickness, and location of layers, regions, and/or structures may be reduced or enlarged for clarity.

In the description of the disclosure, a structure (or a layer, an assembly, a substrate) disposed on or over another structure (or a layer, an assembly, a substrate) means that two structures are adjacent and connected to each other directly, or means that two structures are adjacent and connected to each other indirectly. The indirect connection means that at least one intermediate structure (or at least one intermediate layer, at least one intermediate layer assembly, at least one intermediate substrate) is between two structures. The lower surface of one structure is adjacent to or directly connected to the upper surface of the intermediate structure, and the upper surface of the other one structure is adjacent to or directly connected to the lower surface of the intermediate structure. The intermediate structure can be consisted of a single layer or multiple layers of a solid layer or a non-solid layer, but it is not limited thereto. In this disclosure, when a structure is disposed "on" another structure, it means the structure is "direct" on the another structure, or the structure is "indirect" on the another structure (i.e. at least one structure is clamped between the structure and the another structure).

The terms "about" or "substantially" are generally interpreted as within 20% of a given value or range, or as interpreted as within 10%, 5%, 3%, 2%, 1%, or 0.5% of a given value or range.

In addition, a certain error may be present in a comparison with any two values or directions. If the first value is equal to the second value, it implies that an error of about 10% between the first value and the second value may be present. If the first direction is perpendicular to or "substantially" perpendicular to the second direction, the angle between the first direction and the second direction may be between 80 degrees and 100 degrees. If the first direction is parallel to or "substantially" parallel to the second direction, the angle between the first direction and the second direction may be between 0 degrees and 10 degrees.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The claims and the specification may not use the same terms, and accordingly, the first component in the specification may be the second component in the claims.

In this disclosure, Young's modulus can be measured by a Young's modulus tester, tensile testing machine, or other suitable apparatus or method, but it is not limited thereto. In addition, phrases such as "a given range is a first numerical value to a second numerical value" and "a given range falls within a range of a first numerical value to a second numerical value" represent that the given range includes the first numerical value, the second numerical value, and other numerical values therebetween.

Moreover, the electronic device disclosed in this disclosure can include a display device, a backlight device, an antenna device, a sensing device, a tiled device, a touch display, a curved display, or a free shape display, but it is not limited thereto. The electronic device can include a liquid crystal, a light-emitting diode, a fluorescence, a phosphor, other suitable display medium, or a combination thereof, for example, but it is not limited thereto. The display device can be a non-self-emitting type display device or a self-emitting type display device. The antenna device can be a liquid crystal type antenna device or a non-liquid crystal type antenna device, the sensing device can be a sensing device for sensing capacitance, light, heat, or ultrasonic, but it is not limited thereto. The tiled device can be a tiled display device or a tiled antenna device, but it is not limited thereto. It should be noted that, the electronic device can be any permutation and combination described above, but it is not limited thereto. In addition, the electronic can be a bendable or flexible electronic device. It should be noted that, the electronic device can be any permutation and combination described above, but it is not limited thereto. Furthermore, the appearance of the electronic device can be rectangular, circular, polygonal, a shape with curved edges, or other suitable shapes. The electronic device can include peripheral systems such as a driving system, a control system, a light source system, a shelf system, and etc. to support the display device, the antenna device, or the tiled device. In order to give convenient explanation, the electronic device below is described in the type of the backlight device, but the disclosure does not limit.

It should be noted that, according to the embodiments of the disclosure, an optical microscope (OM), a scanning electron microscope (SEM), a α-step, an ellipsometer, or other suitable method can be used to measure the depth, the thickness, the width, or the height of each of the components, or the gap or the distance between the components. According to some embodiments, the scanning electron microscope can be used to obtain the cross-section structure image with the component that is desired to be measured, and then measure the depth, the thickness, the width, or the height of each of the components, or the gap or the distance between the components.

It should be noted that the following embodiments can replace, recombine, and mix features in several different embodiments to complete other embodiments without departing from the spirit of the present disclosure. The features between the various embodiments can be mixed and used arbitrarily as long as they do not violate or conflict the spirit of the present disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
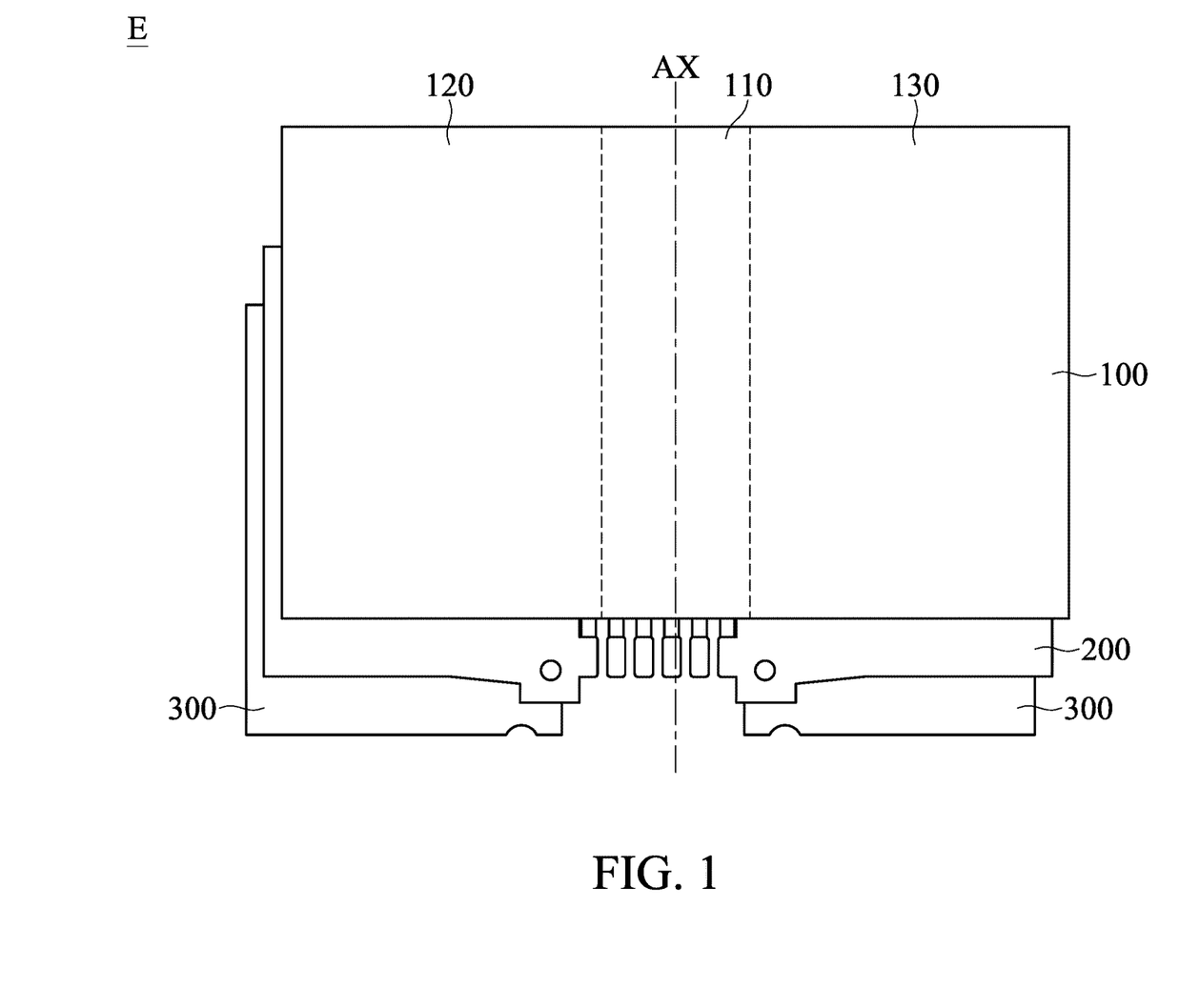
FIG. 1 is a schematic diagram of an electronic device according to an embodiment of the disclosure.

A panel 100 can include a foldable region 110, a first region 120, and a second region 130, but it is not limited thereto. The foldable region 110 can be disposed between the first region 120 and the second region 130, but it is not limited thereto. In some embodiments, the foldable region 110 connects between the first region 120 and the second region 130, but it is not limited thereto. For example, the first region 120 and the second region 130 can be non-foldable regions. In some embodiments, as observed from the cross-sectional view, the radius of curvature of the foldable region 110 is adjustable. In some embodiments, as observed from the cross-sectional view, the radius of curvature of the first region 120 and/or the radius of curvature of the second region 130 are not adjustable. In some embodiments, the foldable region 110 has a folding axis AX. In some embodiments, the panel 100 can include a display panel, a sensing panel, a light-emitting panel, an antenna panel, or other suitable panel, or a combination thereof. In some embodiments, the panel 100 can include an organic light-emitting diode (OLED) panel, a mini LED panel, a micro LED panel, a quantum dot LED panel, a liquid-crystal display (LCD) panel, an antenna panel, or a sensing panel, but it is not limited thereto. In some embodiments, the panel 100 can include various passive components and active components, such as a capacitor, a resistor, an inductor, a diode, a transistor, and etc., wherein the diode can include a light-emitting diode or a photoelectric diode. For example, the light-emitting diode can include an organic light-emitting diode (OLED), a mini LED, a micro LED, a quantum dot LED, other suitable light-emitting diode, or a combination thereof, but it is not limited thereto. In some embodiments, when the panel 100 is a display panel, the first region 120 and the second region 130 can be used to display the image, and the foldable region 110 can be also selectively used to display the image.

Figure 2:
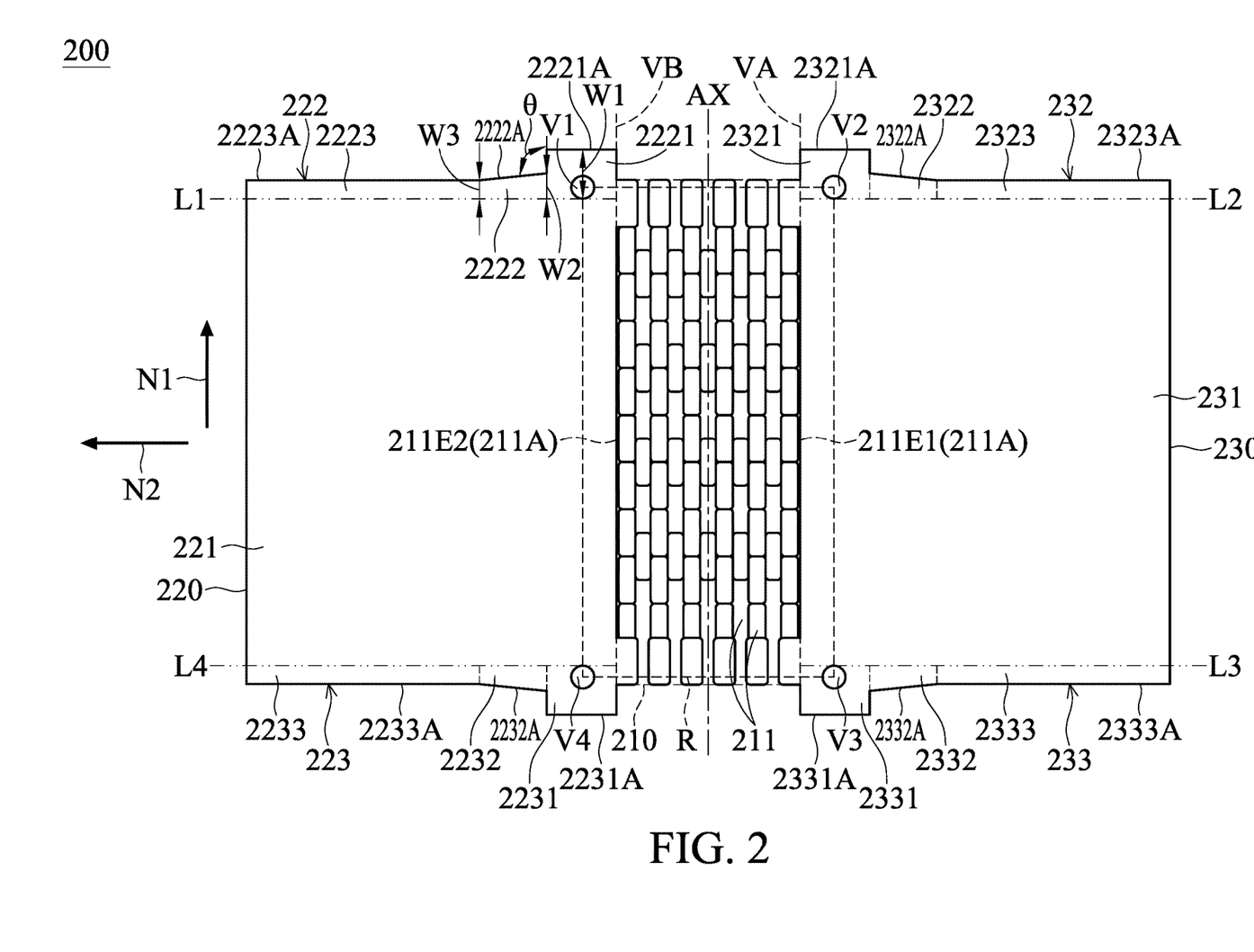
FIG. 2 is a schematic diagram of a supporting sheet according to an embodiment of the disclosure.

Referring to FIG. 1 and FIG. 2, a supporting sheet 200 is disposed under the panel 100. For example, the supporting sheet is configured to support the panel 100. The supporting sheet 200 can include a foldable portion 210, a first non-foldable portion 220, and a second non-foldable portion 230, but it is not limited thereto. The foldable portion 210 connects between the first non-foldable portion 220 and the second non-foldable portion 230, but it is not limited thereto. In other words, the first non-foldable portion 220 can be connected to the foldable portion 210, and the second non-foldable portion 230 can be connected to the foldable portion 210. The foldable portion 210 can include a plurality of openings 211.

When the panel 100 is disposed on the panel 200, the foldable portion 210 is overlapped with the foldable region 110, the first non-foldable portion 220 is overlapped with the first region 120, and the second non-foldable portion 230 is overlapped with the second region 130.

The first non-foldable portion 220 has a first via V1, and the first via V1 is adjacent to the foldable portion 210. As shown in FIG. 2, a virtual line L1 can be defined as a virtual line that is tangent with the far edge 2221A of the first via V1 and substantially perpendicular to the folding axis AX, the detail of the edge 2221A is discussed hereafter. Similarly, the first non-foldable portion 220 has a fourth via V4, and the fourth via V4 is adjacent to the foldable portion 210. As shown in FIG. 2, the first via V1 and the fourth via V4 can be respectively adjacent to the different corners of the foldable portion 210, but it is not limited thereto. As shown in FIG. 2, a virtual line L4 can be defined as a virtual line that is tangent with the far edge 2231A of the fourth via V4 and substantially perpendicular to the folding axis AX, the detail of the edge 2231A is discussed hereafter. For example, the first non-foldable portion 220 can be divided into a main body 221, an upper block 222, and a lower block 223 by the virtual line L1 and the virtual line L4. The main body 221 can be located between the upper block 222 and the lower block 223 or connects between the upper block 222 and the lower block 223. The upper block 222 can be defined as a block above the virtual line L1, and the lower block 223 can be defined as a block below the virtual line L4.

The first non-foldable portion 220 (such as the upper block 222) can include a first part 2221, a second part 2222, and a third part 2223, but it is not limited thereto. For example, the first part 2221 is closer to the foldable portion 210 than the second part 2222, and the second part 2222 is closer to the foldable portion 210 than the third part 2223. Therefore, the first part 2221 is located between the foldable portion 210 and the second part 2222, and the second part 2222 is located between the first part 2221 and the third part 2223.

Figure 3:
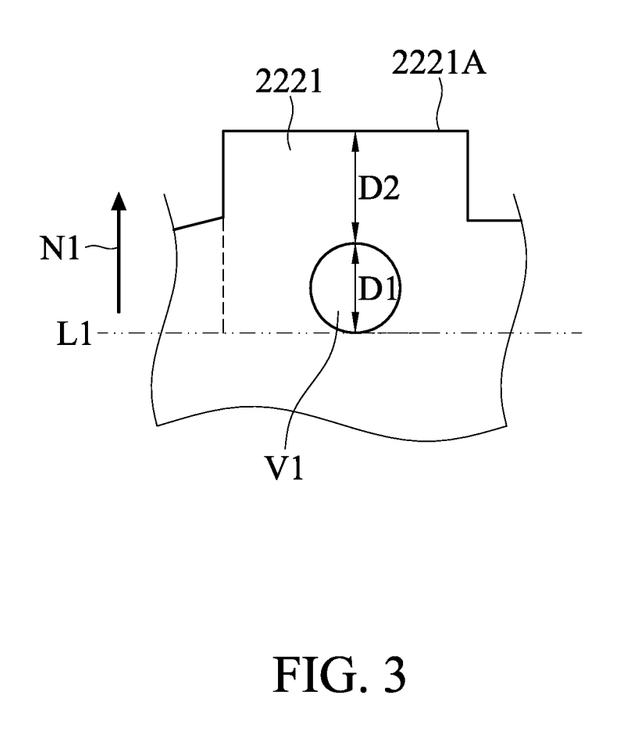
FIG. 3 is a partial enlarged diagram of the supporting sheet according to an embodiments of the disclosure.

As shown in FIG. 2 and FIG. 3, the first part 2221 of the first non-foldable portion 220 has the first via V1. In a first direction N1 that is parallel to the folding axis AX, the first part 2221 protrudes more with respect to the second part 2222. In other words, the first part 2221 can be defined as a part that protrudes more toward the first direction N1 above the virtual line L1. The first part 2221 has the first via V1, and the second part 2222 is located at a side of the first part 2221 away from the foldable portion 210.

In some embodiments, such as in FIG. 2, in the first direction N1, the width W1 of the first part 2221 corresponding to the first via V1 is greater than the width W2 of the second part 2222. For example, the width W1 of the first part 2221 is measured a distance along the first direction N1 from the virtual line L1 to the edge 2221A of the first part 2221, the measuring position of this distance substantially passes through the center of the first via V1, and the first direction N1 is substantially perpendicular to the virtual line L1. For example, the width W2 of the second part 2222 is the width at the boundary of the first part 2221 and the second part 2222 measured along the first direction N1.

As shown in FIG. 2 and FIG. 3, in the first direction N1, the gap D2 between the first via V1 and the edge 2221A of the first part 2221 is greater than or the same as the width D1 of the first via V1 (substantially is the diameter of the first via V1). For example, the gap D2 is substantially measured along the first direction N1 that passes through the center of the first via V1 and is perpendicular to the virtual line L1. In some embodiments, in the first direction N1, the ratio of the gap D2 between the first via V1 and the edge 2221A of the first part 2221 to the width D1 of the first via V1 is greater than or the same as 1 and less than or the same as 3 (i.e. 1≤D2/D1≤3), but it is not limited thereto. In some embodiments, in the first direction N1, the ratio of the gap D2 to the width D1 is greater than or the same as 1.2 and less than or the same as 2.8 (i.e. 1.2≤D2/D1≤2.8). In some embodiments, in the first direction N1, the ratio of the gap D2 to the width D1 is greater than or the same as 1.5 and less than or the same as 2.5 (i.e. 1.5≤D2/D1≤2.5).

Figure 4:
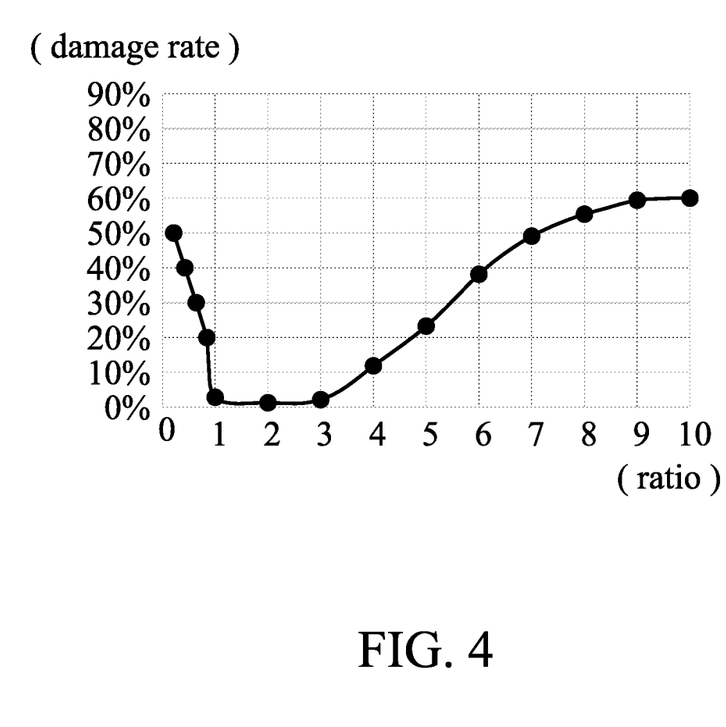
FIG. 4 is a relationship diagram of the ratio of D2/D1 and the damage rate according to an embodiment of the disclosure.

As shown in FIG. 4, if the ratio of the gap D2 to the width D1 is less than 1 (for example, the gap D2 is too small), the intermediary between the first via V1 and the edge 2221A may be broken during the process of the assembling or the manufacturing, the quality of the supporting sheet 200 is reduced or damaged, and thus the failure rate % is increased. If the ratio of the gap D2 to the width D1 is greater than 3 (for example, the gap D2 is too big), the intermediary may be bent during the assembly or folding, the yield rate may be influenced, and thus the failure rate % is increased, but it is not limited thereto.

In some embodiments, the foldable portion 210 can include a plurality of openings 210, and the area of the first via V1 can less than the area of one of the openings 211. For example, the area of the first via V1 can be greater than or equal to 0.05 square millimeters (mm$^2$) and less than or equal to 0.1 square millimeters (mm$^2$) (0.05 mm$^2$≤the area of the first via V1≤0.1 mm$^2$), but it is not limited thereto. In some embodiments, the area of the first via V1 can be greater than or equal to 0.06 square millimeters (mm$^2$) and less than or equal to 0.09 square millimeters (mm$^2$) (0.06 mm$^2$≤the area of the first via V1≤0.09 mm$^2$). In some embodiments, the ratio of the area of the first via V1 to the area of one of the openings 211 is greater than or equal to 0.05 and less than or equal to 0.5 (0.05≤the area of the first via V1/the area of the opening 211≤0.5), but it is not limited thereto. In some embodiments, the ratio of the area of the first via V1 to the area of the opening 211 is ranged from 0.08 to 0.3 (0.08≤the area of the first via V1/the area of the opening 211≤0.3), but it is not limited thereto. In some embodiments, the radius of curvature of the first via V1 is greater than or equal to 0.1 millimeter and less than or equal to 0.3 millimeter (0.1 mm≤the radius of curvature of the first via V1≤0.3 mm), but it is not limited thereto. In some embodiments, the radius of curvature of the first via V1 is greater than or equal to 0.12 millimeter and less than or equal to 0.28 millimeter (0.12 mm≤the radius of curvature of the first via V1≤0.28 mm).

Moreover, it should be noted that, the first via V1 in this embodiment is a through hole penetrating the supporting sheet 200. However, in some embodiments, the first via V1 can be a depression formed on the front surface of the rear surface of the supporting sheet 200 and does not penetrate the supporting sheet 200.

Referring to FIG. 1 and FIG. 2, compared with the second part 2222, the first part 2221 can extend farther along the direction away from the virtual line L1, for example. Therefore, in the first direction N1, the width W1 of the first part 2221 corresponding to the first via V1 is greater than the width W2 of the second part 2222. The definitions of the width W1 and the width W2 can refer to the above description.

In some embodiments, compared with the third part 2223, the second part 2222 can extend farther along the direction away from the virtual line L1, for example. Therefore, in the first direction N1, the width W2 of the second part 2222 is greater than the width W3 of the third part 2223. For example, the width W3 may be the width at the boundary of the second part 2222 and the third part 2223 measured along the first direction N1.

In some embodiments, the edge 2223A of the third part 2223 can be extended along a second direction N2, the second direction N2 is substantially perpendicular to the first direction N1, and the edge 2222A of the second part 2222 can be extended in a direction that is different from the first direction N1 and the second direction N2. In some embodiments, the angle θ between the first part 2221 and the edge 2222A of the second part 2222 can be ranged in 60 degrees to 120 degrees, but it is not limited thereto.

In some embodiments, the edge 2222A of the second part 2222 has an arc side or other suitable appearance. In some embodiments, the edge 2221A of the first part 2221 has an arc side or other suitable appearance.

Referring to FIG. 1 and FIG. 2, the first non-foldable portion 220 (such as the lower block 223) can include another first part 2231, another second part 2232, and/or another third part 2233, but it is not limited thereto. In other words, the first non-foldable portion 220 includes the first part 2221 and the another first part 2231, wherein the first part 2221 is opposite to the another first part 2231 of the first non-foldable portion 220. In some embodiments, the another first part 2231 is closer to the foldable portion 210 than the another second part 2232, and the another second part 2232 is closer to the foldable portion 210 than the another third part 2233. The another first part 2231 is located between the foldable portion 210 and the another second part 2232, and the another second part 2232 is located between the another first part 2231 and the another third part 2233.

Similarly, the another first part 2231 of the first non-foldable portion 220 has the fourth via V4. As described above, the virtual line L4 can be defined as the virtual line that is tangent with the edge of the far edge 2231A of the fourth via V4 (described hereafter) and substantially perpendicular to the folding axis AX. In the first direction N1 that is parallel to the folding axis AX, the another first part 2231 protrudes more with respect to the another second part 2232. The width of the another first part 2231 corresponding to the fourth via V4 (not labeled) is greater than the width of the another second part 2232 (not labeled). For example, the width of the another first part 2231 (not labeled) is measured a distance along the first direction N1 from the virtual line L4 to the edge 2231A of the another first part 2231, and the measuring position of this distance substantially passes through the center of the fourth via V4. For example, the width of the another second part 2232 (not labeled) is the width at the boundary of the another first part 2231 and the another second part 2232 measured along the first direction N1.

Similarly (referring to the descriptions of the width D1 and the gap D2 in FIG. 3), in the first direction N1, the gap between the fourth via V4 and the edge 2231A of the another first part 2231 (not labeled) is greater than or equal to the width of the fourth via V4 (substantially is the diameter of the fourth via V4). For example, the aforementioned gap (not labeled) is measured along the direction that passes through the center of the fourth via V4 and is substantially perpendicular to the virtual line L4. In some embodiments, 1≤the gap between the fourth via V3 and the edge 2231A (not labeled)/the width of the fourth via V4≤3), but it is not limited thereto.

Similarly (referring to the descriptions of the width D1 and the gap D2 in FIG. 3), if the ratio of the gap between the fourth via V4 and the edge 2231A (not labeled) to the width of the fourth via V4 (not labeled) is less than 1, the intermediary between the fourth via V4 and the edge 2231A may be broken during the process of the assembling or the manufacturing because the gap is too small, and the quality of the supporting sheet 200 may be reduced or damaged. If the ratio of the gap between the fourth via V4 and the edge 2231A to the width of the fourth via V4 is greater than 3, the intermediary may be bent during the assembly or folding because the gap is too large, but it is not limited thereto.

Similarly, the designs of the area and the radius of curvature of the fourth via V4 can refer to the first via V1.

Similarly, the fourth via V4 in this embodiment is a through hole penetrating the supporting sheet 200, however, the fourth via V1 in some embodiments can be a depression formed on the front surface of the rear surface of the supporting sheet 200 and does not penetrate the supporting sheet 200.

Similarly, compared with the another second part 2232, the another first part 2231 can extend farther along the direction away from the virtual line L4. Therefore, in the first direction N1, the width of the another first part 2231 corresponding to the fourth via V4 (not labeled) is greater than the width of the another second part 2232 (not labeled). For example, the width of the another first part 2231 is measured a distance along the first direction N1 from the virtual line L4 to the edge 2231A of the another first part 2231, and the measuring position of this distance substantially passes through the center of the fourth via V4. For example, the width of the another second part 2232 (not labeled) is the width at the boundary of the another first part 2231 and the another second part 2232 measured along the first direction N1.

Compared with the another third part 2233, the another second part 2232 can extend farther along the direction away from the virtual line L4. Therefore, in the first direction N1, the width of the another second part 2232 is greater than the width of the another third part 2233. For example, the width of the third part 2233 can be the width at the boundary of the another second part 2232 and the another third part 2233 measured along the first direction N1.

In some embodiments, the edge 2233A of the another third part 2233 can be substantially extended along the second direction N2, and the edge 2232A of the another second part 2232 can be substantially extended in a direction that is different from the first direction N1 and the second direction N2. In some embodiments, the angle between the another first part 2231 and the edge 2232A of the another second part 2232 can be ranged in 60 degrees to 120 degrees, but it is not limited thereto.

Similarly, the edge 2232A of the another second part 2232 and the edge 2231A of the another first part 2231 can have arc sides or other suitable appearances.

Referring to FIG. 2, similarly, in some embodiments, the second non-foldable portion 230 has a second via V2 and a third via V3. For example, the second via V2 and the third via V3 can adjacent to the different corners of the foldable portion 210, but it is not limited thereto. A virtual line L2 can be defined as a virtual line that is tangent with the far edge 2321A of the second via V2 and substantially perpendicular to the folding axis AX, the detail of the edge 2321A is discussed hereafter. Similarly, a virtual line L3 can be defined as a virtual line that is tangent with the far edge 2331A of the third via V3 and perpendicular to the folding axis AX, the detail of the edge 2331A is discussed hereafter. Similarly, the second non-foldable portion 230 can be divided into a main body 231, an upper block 232, and a lower block 233 by the virtual line L2 and the virtual line L3. The main body 221 can be located between the upper block 232 and the lower block 233 or connects between the upper block 232 and the lower block 233. The upper block 232 can be a block above the virtual line L2, and the lower block 233 can be a block below the virtual line L3.

Similar to the first non-foldable portion 220, the upper block 232 of the second non-foldable portion 230 includes a first part 2321, a second part 2322, and a third part 2323, but it is not limited thereto. The first part 2321 is closer to the foldable portion 210 than the second part 2322, and the second part 2322 is closer to the foldable portion 210 than the third part 2323. The first part 2321 is located between the foldable portion 210 and the second part 2322, and the second part 2322 is located between the first part 2321 and the third part 2323.

The first part 2321 of the second non-foldable portion 230 includes a second via V2. In the first direction N1, the width of the first part 2321 corresponding to the second via V2 (not labeled) is greater than the width of the second part 2322 (not labeled). For example, the width of the first part 2321 (not labeled) is measured a distance along the first direction N1 from the virtual line L2 to the edge 2321A of the first part 2321, the measuring position of this distance substantially passes through the center of the second via V2, and the first direction N1 is substantially perpendicular to the extending line of the virtual line L2. For example, the width W2 of the second part 2322 (not labeled) is the width at the boundary of the first part 2321 and the second part 2322 measured along the first direction N1.

In some embodiments, in the first direction N1, the width of the second via V2 (substantially is the diameter of the second via V2) can be less than or equal to the gap between the second via V2 and the edge 2321A of the first part 2321 (not labeled). The aforementioned gap is substantially measured along the direction that passes through the center of the second via V2 and is perpendicular to the virtual line L2. In some embodiments, 1≤the gap between the second via V2 and the edge 2321A/the width of the second via V2≤3, but it is not limited thereto. The advantages of this design can refer to the aforementioned descriptions of the gap D2 and the width D1.

In some embodiments, the area of the second via V2 can be less than the area of each of the openings 211 on the foldable portion 210. The designs of the area, the dimensions, or the radius of curvature of the second via V2 can refer to the first via V1. In some embodiments, the area, the dimensions, or the radius of curvature of the second via V2 can be the same as or different from the first via V1.

The second via V2 in this embodiment is a through hole penetrating the supporting sheet 200, for example. However, in some embodiments, the second via V2 can be a depression formed on the front surface of the rear surface of the supporting sheet 200 and does not penetrate the supporting sheet 200.

As described above, compared with the second part 2322, the first part 2321 can extend farther along the direction away from the virtual line L2. In the first direction N1, the width of the first part 2321 corresponding to the second via V2 (not labeled) is greater than the width of the second part 2322. The definitions of the width of the first part 2321 corresponding to the second via V2 can refer to the above description.

In some embodiments, compared with the third part 2323, the second part 2322 can extend farther along the direction away from the virtual line L2. In the first direction N1, the width of the second part 2322 (not labeled) is greater than the width of the third part 2323 (not labeled). For example, the width of the third part 2323 may be the width at the boundary of the second part 2322 and the third part 2323 measured along the first direction N1.

In some embodiments, the edge 2323A of the third part 2323 can be substantially extended along the second direction N2, and the edge 2322A of the second part 2322 can be substantially extended in a direction that is different from the first direction N1 and the second direction N2. In some embodiments, the angle between the first part 2321 and the edge 2322A of the second part 2322 can be ranged in 60 degrees to 120 degrees, but it is not limited thereto.

In some embodiments, the edge 2322A of the second part 2322 and/or the edge 2321A of the first part 2321 have an arc side or other suitable appearance.

Similarly, the lower block 233 of the second non-foldable portion 230 includes another first part 2331, another second part 2332, and another third part 2333, but it is not limited thereto. In other words, the second non-foldable portion 230 includes the first part 2321 and the another first part 2331, wherein the first part 2321 is opposite to the another first part 2331 of the second non-foldable portion 230. Similarly, the another first part 2331 is closer to the foldable portion 210 than the another second part 2332, and the another second part 2332 is closer to the foldable portion 210 than the another third part 2333. The another first part 2331 is located between the foldable portion 210 and the another second part 2332, and the another second part 2332 is located between the another first part 2331 and the another third part 2333.

Similarly, the another first part 2331 of the second non-foldable portion 230 has the third via V3. In the first direction N1 that is parallel to the folding axis AX, the another first part 2331 protrudes more with respect to the another second part 2332. In some embodiments, in the first direction N1, the width of the another first part 2331 corresponding to the third via V3 (not labeled) is greater than the width of the another second part 2332 (not labeled). For example, the width of the another first part 2331 (not labeled) is measured a distance along the first direction N1 from the virtual line L3 to the edge 2331A of the another first part 2331, the measuring position of this distance substantially passes through the center of the third via V3, and the first direction N1 is substantially perpendicular to the virtual line L2. For example, the width of the another second part 2332 (not labeled) is the width at the boundary of the another first part 2331 and the another second part 2332 measured along the first direction N1.

In some embodiments, in the first direction N1, the width of the third via V3 (substantially is the diameter of the third via V3) is less than or equal to the gap between the third via V2 and the edge 2331A of the another first part 2331 (not labeled). The aforementioned gap is substantially measured along the direction that passes through the center of the third via V3 and is perpendicular to the virtual line L3. In this embodiments, 1≤the gap between the third via V3 and the edge 2331A/the width of the third via V3≤3).

In some embodiments, the area of the third via V3 can be less than the area of each of the openings 211 on the foldable portion 210. The designs of the area, the dimensions, or the radius of curvature of the third via V3 can refer to the first via V1. In some embodiments, the area, the dimensions, or the radius of curvature of the third via V3 can be the same as or different from the first via V1.

Moreover, it should be noted that, the third via V3 in this embodiment is a through hole penetrating the supporting sheet 200. However, in some embodiments, the third via V3 can be a depression formed on the front surface of the rear surface of the supporting sheet 200 and does not penetrate the supporting sheet 200.

As described above, compared with the another second part 2332, the another first part 2331 can extend farther along the direction away from the virtual line L3. In the first direction N1, the width of the another first part 2331 corresponding to the third via V3 (not labeled) is greater than the width of the another second part 2332. The definitions of the width of the another first part 2331 corresponding to the third via V3 can refer to the above description.

In some embodiments, compared with the another third part 2333, the another second part 2332 can extend farther along the direction away from the virtual line L3. In the first direction N1, the width of the another second part 2332 (not labeled) is greater than the width of the another third part 2333 (not labeled). For example, the width of the another third part 2333 may be the width at the boundary of the another second part 2332 and the another third part 2333 measured along the first direction N1.

In some embodiments. the edge 2333A of the another third part 2333 can be substantially extended along the second direction N2, and the edge 2332A of the another second part 2332 can be substantially extended in a direction that is different from the first direction N1 and the second direction N2. In some embodiments, the angle between the another first part 2331 and the edge 2332A of the another second part 2332 can be ranged in 60 degrees to 120 degrees, but it is not limited thereto.

In some embodiments, the edge 2332A of the another second part 2332 and/or the edge 2331A of the another first part 2321 have an arc side or other suitable appearance. In some embodiments, the appearances of the first via V1, the second via V2, the third via V3, and the fourth via V4 are not limited to circles, they can include different appearances according to the requirements.

Owing to the arrangements of the first via V1, the second via V2, the third via V3, and the fourth via V4, the break of the supporting sheet 200 from the outside to the inside during the manufacturing, which may influence the openings 211 of the foldable portion 210, can be reduced. For example, the first via V1, the second via V2, the third via V3, and the fourth via V4 can enhance the effect of crack stop, so as to enhance the yield rate and the reliability of the supporting sheet 200 and the electronic device E, but the advantages are not limited thereto. Moreover, for example, the first via V1, the second via V2, the third via V3, and the fourth via V4 can be arranged to calibrate the quality control of the supporting sheet 200, such as by observing the relative relationships between the first via V1, the second via V2, the third via V3, and/or the fourth via V4, such as the distance between the vias, the relative area surrounding by the vias, or the relative relationships between the connection lines of the vias and other components, to determine that whether the supporting sheet 200 is deformed, and the quality of the supporting sheet 200 can be controlled.

As shown in FIG. 2, the first via V1, the second via V2, the third via V3, and the fourth via V4 can define a region R. The area of this region R can be greater than the area of the foldable portion 210, and the region R can substantially cover the foldable portion 210. The region R is a region defined by the connecting lines of the centers of the first via V1, the second via V2, the third via V3, and the fourth via V4. Furthermore, as described before, in some embodiments, the foldable portion 210 has a plurality of openings 211 arranged in sequence. According to these openings 211, they can be substantially within the confines of a region 211A. For example, the region 211A is a rectangular region with all of the openings 211 therein. The region 211A can have a first side 211E1 and a second side 211E2 that are opposite to each other. The extending direction of the first side 211E1 and/or the extending direction of the second side 211E2 can be parallel to the first direction N1. Moreover, a virtual extending line VA and a virtual extending line VB can be obtained based on the first side 211E1 and the second side 211E2. The portion of the supporting sheet 200 between the virtual extending line VA and the virtual extending line VB can be defined as the foldable portion 210.

In some embodiments, the ratio of the area of the region R to the area of the foldable portion 210 is greater than 1 and less than or equal to 5 (1<the area of the region R/the area of the foldable portion 210≤5), but it is not limiter thereto. In some embodiments, the ratio of the area of the region R to the area of the foldable portion 210 is greater than 1.5 and less than or equal to 4.5 (1.5<the area of the region R/the area of the foldable portion 210≤4.5). In some embodiments, the ratio of the area of the region R to the area of the foldable portion 210 is greater than 2 and less than or equal to 3 (2<the area of the region R/the area of the foldable portion 210≤3).

Figure 5:
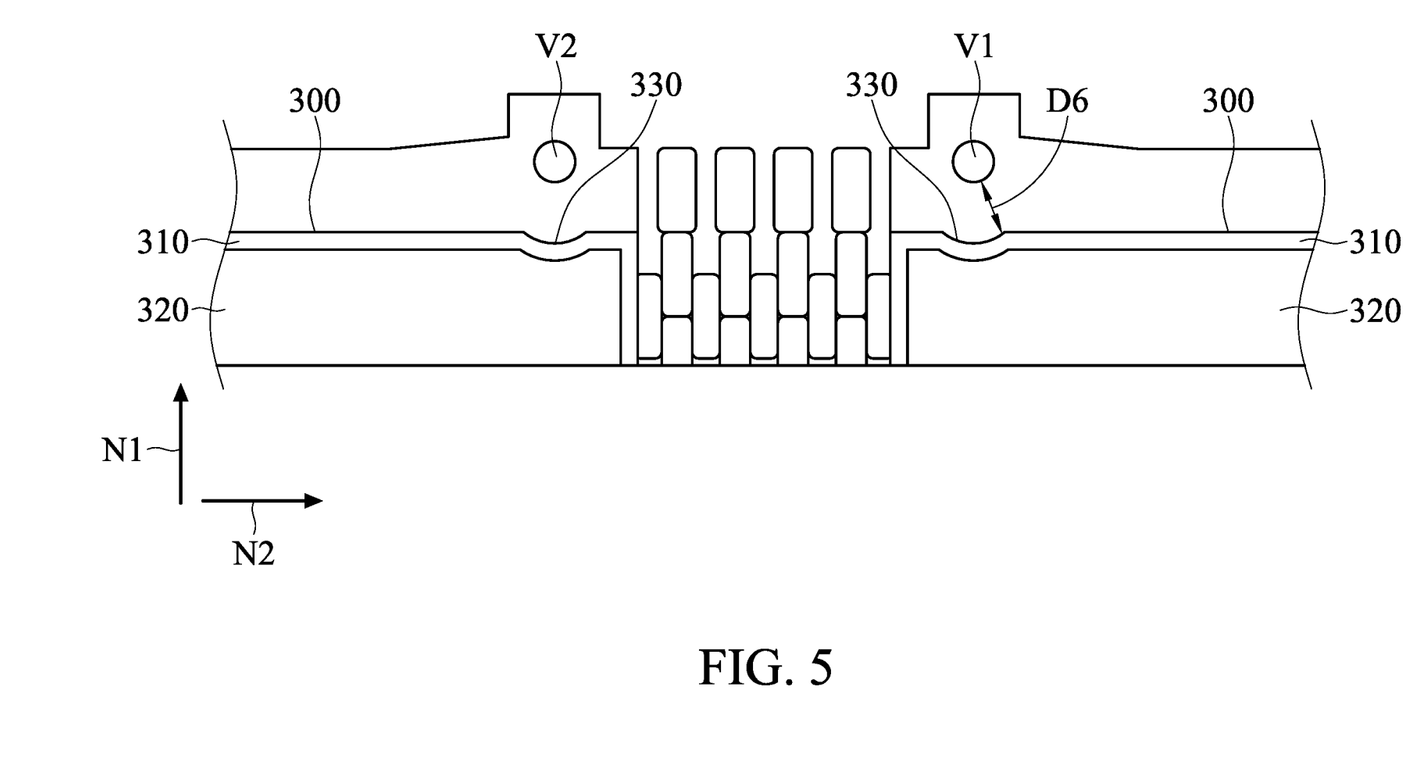
FIG. 5 is a partial enlarged diagram of the electronic device according to an embodiment of the disclosure.

Referring to FIG. 1 and FIG. 5, a heat dissipating sheet 300 can be disposed under the supporting sheet 200 and configured to enhance the heat dissipating efficiency of the electronic device E. The heat dissipating sheet 300 can include a metal sheet 310 and/or a graphite sheet 320, but it is not limited thereto. The metal sheet 310 can include copper, aluminum, silver, other suitable material, or a combination thereof, but it is not limited thereto. For example, the metal sheet 310 can be in contact with the supporting sheet 200, and the graphite sheet can attached on the metal sheet 310, but it is not limited thereto. The heat generated from the operation of the panel 100 can be transferred to the heat dissipating sheet 300 through the supporting sheet 200, so that the heat dissipating efficiency can be enhanced through the heat dissipating sheet 300.

As shown in FIG. 5, notches 330 can be formed on the portion of the heat dissipating sheet 300 that is adjacent to the first via V1 and/or the second via V2 (such as the notch having an arc side, but it is not limited thereto). In other words, the notches 330 can be disposed corresponding to the first via V1 and/or the second via V2. In other embodiment (not shown), similarly, notches 330 can be formed on the portion of the heat dissipating sheet 300 that is adjacent to the third via V3 and/or the fourth via V4 (such as the notch having an arc side, but it is not limited thereto). In other words, the notches 330 can be disposed corresponding to the third via V3 and/or the fourth via V4. The heat dissipating sheet 300 and the first via V1 (or the second via V2) can be separated by a distance D6. For example, the distance D6 can be a shortest distance between the heat dissipating sheet 300 and the first via V1 (or the second via V2). In some embodiments, the distance D6 can be greater than or equal to 0.2 millimeter or less than or equal to 6 millimeter, but it is not limited thereto. In some embodiments, the distance D6 can be greater than or equal to 0.5 millimeter or less than or equal to 4 millimeter, but it is not limited thereto. In some embodiments, the first via V1, the second via V2, the third via V3, and the fourth via V4 can be used to position the heat dissipating sheet 300 to a predetermined position relative to the supporting sheet 200, but it is not limited thereto.

In some embodiments, the first part 2221, the another first part 2231, the first part 2321, and the another first part 2331 of the supporting sheet 200 can be adjacent to or abut the foldable portion 210, but it is not limited thereto. In some embodiments (not shown), other portion(s) of the supporting portion 200 can be inserted between the first part 2221, the another first part 2231, the first part 2321, and the another first part 2331 of the supporting sheet 200 and the foldable portion 210.

Figure 6:
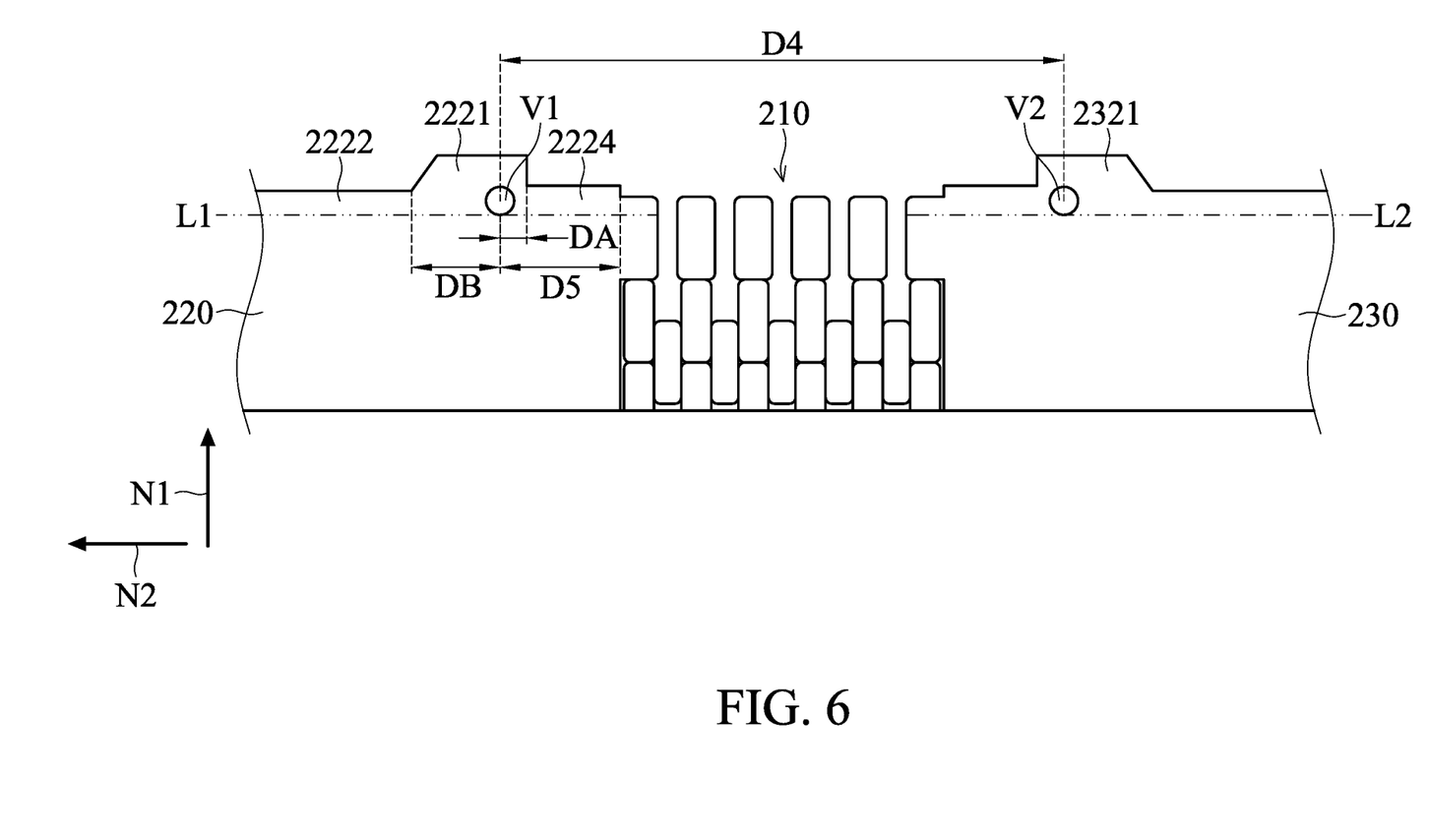
FIG. 6 is a schematic diagram of a supporting sheet according to another embodiment of the disclosure.

For example, as shown in FIG. 6, a fourth part 2224 can be disposed between the first part 2221 and the foldable portion 210. In the first direction N1, the first part 2221 protrudes more with respect to the fourth part 2224. In some embodiments, in the second direction N2 (substantially perpendicular to the first direction N1), the distance DA between the first via V1 and the fourth part 2224 can be less than the distance DB between the first via V1 and the second part 2222. The distance DA can be defined as the shortest distance between the center of the first via V1 and the fourth part 2224 in the second direction N2. The distance DB can be defined as the shortest distance between the first via V1 and the second part 2222 in the second direction N2. In some embodiments, the distance D5 between the first via V1 and the foldable portion 210 can be ranged in 1 millimeter to 5 millimeter (1 millimeter≤the distance D5≤5 millimeter), but it is not limited thereto. In some embodiments, the distance D5 can be ranged in 1.5 millimeter to 4.5 millimeter (1.5 millimeter≤the distance D5≤4.5 millimeter). In some embodiments, the distance D5 can be ranged in 2 millimeter to 4 millimeter (2 millimeter≤the distance D5≤4 millimeter). When the distance D5>5 millimeter, the fixing effect of the fixing mechanism F (referring to FIG. 8) is less effective. When the distance D5<1 millimeter, the region between the first via V1 and the foldable portion 210 is too small, so that the patterning of the openings 211 of the foldable portion 210 may be influenced, or the folding effect may be influenced.

In some embodiments, the ratio of the distance D5 to the width D1 of the first via V1 is 5 to 30 (5≤the distance D5/the width D1≤30), but it is not limited thereto. In some embodiments, the ratio of the distance D5 to the width D1 of the first via V1 is 10 to 25 (10≤the distance D5/the width D1≤25). In some embodiments, the ratio of the distance D5 to the width D1 of the first via V1 is 15 to 30 (15≤the distance D5/the width D1≤30). Similarly, the fourth part (not shown) can also be formed between the another part 2231, the first part 2321, or the another part 2231 and the foldable portion 210, so that the features thereof are not repeated in the interest of brevity.

Referring to FIG. 6, in some embodiments, in the second direction N2, the distance D4 between the first via V1 (such as the center of the first via V1) and the second via V2 (such as the center of the second via V2) can be ranged in 5 millimeter to 30 millimeter (5 millimeter≤the distance D4≤30 millimeter), but it is not limited thereto. In some embodiments, in the second direction N2, the distance D4 can be ranged in 8 millimeter to 27 millimeter (8 millimeter≤the distance D4≤27 millimeter), but it is not limited thereto. In some embodiments, the distance D4 can be ranged in 10 millimeter to 20 millimeter (10 millimeter≤the distance D4≤20 millimeter). If the distance D4 is less than 5 millimeter, the space of the foldable portion 210 is restricted, and the foldability of the electronic device E is influenced. If the distance D4 is greater than 30 millimeter, the fixing effect of the first via V1 and the second via V2 in the process is not facilitated. Similarly, in the second direction N2, the distance (not shown) between the third via V3 (such as the center of the third via V3) and the fourth via V4 (such as the center of the fourth via V4) can be ranged in millimeter to 30 millimeter (5 millimeter≤the distance≤30). In some embodiments, the distance between the third via V3 and the fourth via V4 (not shown) can be the same as or different from the distance D4 between the first via V1 and the second via V2.

Figure 7:
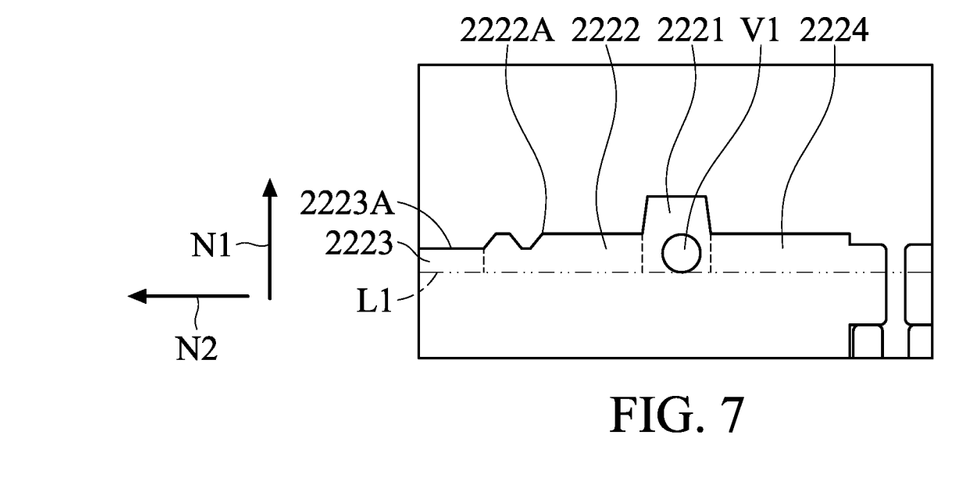
FIG. 7 is a schematic diagram of a supporting sheet according to another embodiment of the disclosure.

The appearances of the edges of the first part, the second part, the third part, and/or the fourth part can be adjusted as required. As shown in FIG. 7, the edge 2222A of the second part 2222 is not inclined relative to the edge 2223A of the third part 2223, and has an irregular appearance. The edge 2222A of the second part 2222 is formed by a straight edge and a curved edge, but it is not limited thereto.

Figure 8:
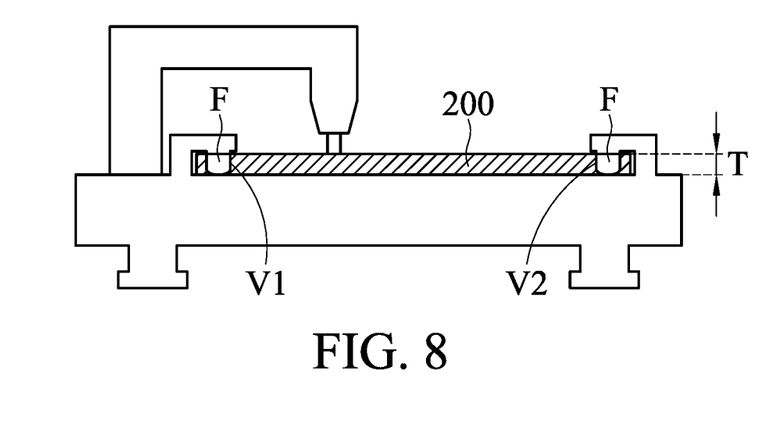
FIG. 8 is a schematic diagram representing that a fixing mechanism inserts into a via of a supporting sheet according to some embodiments of the disclosure.

Referring to FIG. 8, when a laser or a cutter is used to process the supporting sheet 200 to form the openings 211 on the foldable portion 210, the fixing mechanism F can be disposed into the first via V1, the second via V2, the third via V3, and/or the fourth via V4, but it is not limited thereto. Thus, the support sheet 200 can be steadily affixed on the carrier, the displacement of the supporting sheet 200 which may influence the formation of the openings 211 can be reduced. However, the advantages of the design of the first via V1, the second via V2, the third via V3, and/or the fourth via V4 are not limited thereto. In some embodiments, in the normal direction Z of the supporting sheet 200, the depth T of the first via V1, the second via V2, the third via V3, and/or the fourth via V4 can be greater than or equal to 0.05 millimeter and less than or equal to 0.3 millimeter (0.05 millimeter≤the thickness T≤0.3 millimeter), but it is not limited thereto. When the depth has the aforementioned design, the separation of the fixing mechanism F from the first via V1, the second via V2, the third via V3, and/or the fourth via V4 in the process can be prevented, and the thinness of the electronic device E can be ensured.

During the assembly of the electronic device E, the mechanism can be disposed in the first via V1, the second via V2, the third via V3, and/or the fourth via V4 to fix the supporting sheet 200, and each components (or each layers) can be carried by this mechanism. Thus, the deviation of each components (or each layers) in the assembly can be prevented, and the quality of assembly can be increased.

Figure 9:
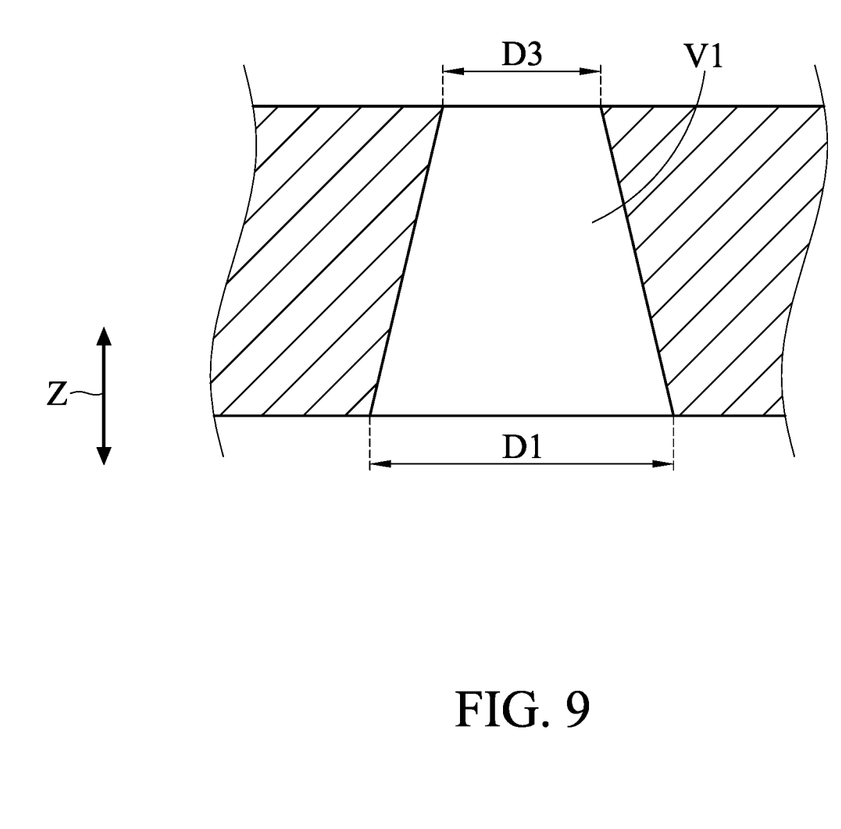
FIG. 9 is a schematic diagram of a via according to another embodiment of the disclosure.

Referring to FIG. 9, in some embodiments, as observed from the cross-sectional structures of the first via V1, the second via V2, the third via V3, and the fourth via V4, the cross-sections of these vias can have trapezoidal shapes, but it is not limited thereto. For example, the end of the first via V1, the second via V2, the third via V3, or the fourth via V4 adjacent to the heat dissipating sheet 300 may have a width (a diameter) that is different from the other end adjacent to the panel 100. In particular, the end of the first via V1, the second via V2, the third via V3, and/or the fourth via V4 adjacent to the heat dissipating sheet 300 may have a width D1, and the end of the first via V1, the second via V2, the third via V3, and/or the fourth via V4 adjacent to the panel 100 may have a width D3. The width D1 in FIG. 9 may correspond to the width D1 in FIG. 2.

In some embodiments, the ratio of the width D1 to the width D3 can be greater than 1 and less than or equal to 2 (1<the width D1/the width D3≤2), but it is not limited thereto. Owing to the aforementioned design, since the panel and the supporting sheet 200 can be affixed to each other by an affixing member (not shown), when the ends of these vias adjacent to the panel 100 have the smaller width D3, the affixing area between the panel 100 and the supporting sheet 200 may be increased, and the yield rate of the electronic device E can be enhanced.

The features between the aforementioned embodiments can be used or combined as long as they do not violate or conflict the spirit of the present application.

In summary, an embodiment of the disclosure provides an electronic device, including a panel and a supporting sheet. The panel includes a foldable region with a folding axis. The supporting sheet is disposed under the panel, and includes a foldable portion and a first non-foldable portion. The foldable portion is overlapped with the foldable region. The first non-foldable portion is connected to the foldable portion, and includes a first part and a second part. The first part is located between the second part and the foldable portion.

The first part has a first via, and the first part protrudes more in a first direction parallel to the folding axis with respect to the second part.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the disclosure has been described by way of example and in terms of preferred embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
   a panel, having a foldable region with a folding axis; and
   a supporting sheet, disposed under the panel and comprising:
   a foldable portion, overlapped with the foldable region; and
   a first non-foldable portion, connecting to the foldable portion and comprising a first part and a second part, wherein the first part is located between the second part and the foldable portion, the first part has a first via, and the first part protrudes more in a first direction parallel to the folding axis with respect to the second part.

2. The electronic device as claimed in claim 1, wherein a width of the first part corresponding to the first via is greater than a width of the second part in the first direction.

3. The electronic device as claimed in claim 2, wherein the first non-foldable portion further comprises a third part, the second part is located between the first part and the third part, and the width of the second part is greater than a width of the third part in the first direction.

4. The electronic device as claimed in claim 3, wherein an edge of the third part extends along a second direction perpendicular to the first direction, and an edge of the second part extends along a direction different from the first direction and the second direction.

5. The electronic device as claimed in claim 1, wherein in the first direction, a gap between the first via and an edge of the first part is less than or equal to a width of the first via.

6. The electronic device as claimed in claim 5, wherein in the first direction, a ratio of the gap between the first via and the edge of the first part to the width of the first via is greater than or equal to 1 and less than or equal to 3.

7. The electronic device as claimed in claim 1, wherein the supporting sheet further comprises:
   a second non-foldable portion, wherein the foldable portion connects between the first non-foldable portion and the second non-foldable portion, the second non-foldable portion comprises a first part and another first part opposite to the first part, the first part of the second non-foldable portion has a second via, and the another first part of the second non-foldable portion has a third via,
   wherein the first non-foldable portion further comprises another first part opposite to the first part of the first non-foldable portion, and the another first part of the first non-foldable portion has a fourth via,
   wherein the first via, the second via, the third via, and the fourth via define a region, and an area of the region is greater than an area of the foldable portion.

8. The electronic device as claimed in claim 7, wherein a ratio of the area of the region to the area of the foldable portion is greater than 1 and less than or equal to 5.

9. The electronic device as claimed in claim 1, wherein an area of the first via is greater than or equal to $0.05 \text{ mm}^2$ and less than or equal to $0.1 \text{ mm}^2$.

10. The electronic device as claimed in claim 1, wherein a radius of curvature of the first via is greater than or equal to 0.1 mm and less than or equal to 0.3 mm.

11. The electronic device as claimed in claim 1, wherein the foldable portion further comprises a plurality of openings, and the ratio of an area of the first via to an area of one of the plurality of openings is greater than or equal to 0.05 and less than or equal to 0.5.

12. The electronic device as claimed in claim 1, wherein a depth of the first via is greater than or equal to 0.05 mm and less than or equal to 0.3 mm.

13. The electronic device as claimed in claim 1, wherein the electronic device further comprises a heat dissipating sheet disposed under the supporting sheet, the heat dissipating sheet comprises a metal sheet and a graphite sheet, the metal sheet is in contact with the supporting sheet, and the graphite sheet is attached on the metal sheet.

14. The electronic device as claimed in claim 13, wherein a notch is formed on a portion of the heat dissipating sheet that is adjacent to the first via.

15. The electronic device as claimed in claim 13, wherein the heat dissipating sheet and the first via are separated by a distance, and the distance is greater than or equal to 0.2 mm or less than or equal to 6 mm.

16. The electronic device as claimed in claim 1, wherein the first non-foldable portion further comprises a fourth part, disposed between the first part and the foldable portion, wherein the first part protrudes more with respect to the fourth part in the first direction, and a distance between the first via and the fourth part is less than a distance between the first via and the second part.

17. The electronic device as claimed in claim 1, wherein the supporting sheet further comprises a second non-foldable portion, the foldable portion connects between the first non-foldable portion and the second non-foldable portion, the second non-foldable portion has a second via, and a distance between the first via and the second via is 5 mm to 30 mm.

18. The electronic device as claimed in claim 1, wherein an angle between the first part and an edge of the second part is 60 degrees to 120 degrees.

19. The electronic device as claimed in claim 1, wherein an edge of the second part has an irregular appearance.

20. The electronic device as claimed in claim 1, wherein a cross-section of the first via has a trapezoidal shape.

* * * * *